United States Patent
Kim et al.

(10) Patent No.: US 8,674,485 B1
(45) Date of Patent: Mar. 18, 2014

(54) SEMICONDUCTOR DEVICE INCLUDING LEADFRAME WITH DOWNSETS

(75) Inventors: Gi Jeong Kim, Guri-si (KR); Jae Yoon Kim, Gangdong-gu (KR); Kyu Won Lee, Seongbuk-gu (KR)

(73) Assignee: Amkor Technology, Inc., Chandler, AZ (US)

( * ) Notice: Subject to any disclaimer, the term of this patent is extended or adjusted under 35 U.S.C. 154(b) by 471 days.

(21) Appl. No.: 12/963,431

(22) Filed: Dec. 8, 2010

(51) Int. Cl.
*H01L 23/495* (2006.01)

(52) U.S. Cl.
USPC ............... 257/676; 257/666; 257/E23.01

(58) Field of Classification Search
USPC ............... 257/666, 676, 670, 690, E23.01; 438/123
See application file for complete search history.

(56) References Cited

U.S. PATENT DOCUMENTS

| | | | |
|---|---|---|---|
| 112,148 A | 2/1871 | Jordeson |
| 118,120 A | 8/1871 | Feegtjsok |
| 122,124 A | 12/1871 | Marsden |
| 138,140 A | 4/1873 | Elsey |
| 144,158 A | 10/1873 | Stoeee |
| 154,156 A | 8/1874 | Shuttle Worth |
| 212,248 A | 2/1879 | McLinden |
| 369,248 A | 8/1887 | Johnson |
| 393,997 A | 12/1888 | MeDougall |
| 459,493 A | 9/1891 | Foose |
| 629,639 A | 7/1899 | Wilkins et al. |
| 720,225 A | 2/1903 | Glum |
| 720,234 A | 2/1903 | Elbrecht |
| 794,572 A | 7/1905 | Wagner |
| 844,665 A | 2/1907 | Dills |
| 936,671 A | 10/1909 | Peteb |
| 941,979 A | 11/1909 | Denhabd |
| 964,284 A | 7/1910 | Lockeaw |
| 989,608 A | 4/1911 | Jackson |
| 992,775 A | 5/1911 | John |
| 1,032,037 A | 7/1912 | Willems |
| 1,106,456 A | 8/1914 | John |
| 1,175,250 A | 3/1916 | Ewart |

(Continued)

FOREIGN PATENT DOCUMENTS

| | | |
|---|---|---|
| DE | 19734794 A1 | 8/1997 |
| EP | 0393997 | 10/1990 |

(Continued)

OTHER PUBLICATIONS

National Semiconductor Corporation, "Leadless Leadframe Package," Informational Pamphlet from webpage, 23 pages, Oct. 2002, www.national.com (see pp. 1-23 of attachment NPLdocs).

(Continued)

*Primary Examiner* — Chuong A Luu
*Assistant Examiner* — Nga Doan

(57) ABSTRACT

In one embodiment, a semiconductor package includes a generally planar die paddle or die pad that defines multiple peripheral edge segments, and includes one or more tie bars protruding therefrom. In addition, the semiconductor package includes a plurality of leads, portions of which protrude from respective side surfaces of a package body of the semiconductor package. Connected to the top surface of the die pad is at least one semiconductor die which is electrically connected to at least some of the leads. At least portions of the die pad, the leads, and the semiconductor die are encapsulated by the package body. The one or more tie bars and the plurality of leads include downsets that are sized and oriented relative to each other to facilitate enhanced manufacturing.

20 Claims, 10 Drawing Sheets

(56) References Cited

U.S. PATENT DOCUMENTS

| | | | |
|---|---|---|---|
| 1,205,544 A | 11/1916 | Johansson | |
| 1,251,747 A | 1/1918 | Breuckman | |
| 2,129,948 A | 9/1938 | Lemmon | |
| 2,596,993 A | 5/1952 | Gookin | |
| 3,177,060 A | 4/1965 | Pedersen | |
| 3,435,815 A | 4/1969 | Forcier | |
| 3,734,660 A | 5/1973 | Davies et al. | |
| 3,838,984 A | 10/1974 | Crane et al. | |
| 4,054,238 A | 10/1977 | Lloyd | |
| 4,098,864 A | 7/1978 | Morris | |
| 4,189,342 A | 2/1980 | Kock | |
| 4,258,381 A | 3/1981 | Inaba | |
| 4,289,922 A | 9/1981 | Devlin | |
| 4,301,464 A | 11/1981 | Otsuki et al. | |
| 4,332,537 A | 6/1982 | Slepcevic | |
| 4,417,266 A | 11/1983 | Grabbe | |
| 4,451,224 A | 5/1984 | Harding | |
| 4,530,152 A | 7/1985 | Roche | |
| 4,541,003 A | 9/1985 | Otsuka et al. | |
| 4,646,710 A | 3/1987 | Schmid et al. | |
| 4,707,724 A | 11/1987 | Suzuki et al. | |
| 4,727,633 A | 3/1988 | Herrick | |
| 4,737,839 A | 4/1988 | Burt | |
| 4,756,080 A | 7/1988 | Thorp et al. | |
| 4,812,896 A | 3/1989 | Rothgery et al. | |
| 4,907,067 A | 3/1990 | Derryberry | |
| 4,920,074 A | 4/1990 | Shimizu et al. | |
| 4,935,803 A | 6/1990 | Kalfus | |
| 4,942,454 A | 7/1990 | Mori et al. | |
| 4,987,475 A | 1/1991 | Schlesinger et al. | |
| 5,018,003 A | 5/1991 | Yasunaga et al. | |
| 5,029,386 A | 7/1991 | Chao et al. | |
| 5,041,902 A | 8/1991 | McShane | |
| 5,057,900 A | 10/1991 | Yamazaki | |
| 5,059,379 A | 10/1991 | Tsutsumi et al. | |
| 5,065,223 A | 11/1991 | Matsuki et al. | |
| 5,070,039 A | 12/1991 | Johnson et al. | |
| 5,087,961 A | 2/1992 | Long | |
| 5,091,341 A | 2/1992 | Asada et al. | |
| 5,096,852 A | 3/1992 | Hobson | |
| 5,118,298 A | 6/1992 | Murphy | |
| 5,122,860 A | 6/1992 | Kikuchi | |
| 5,129,473 A | 7/1992 | Boyer | |
| 5,134,773 A | 8/1992 | LeMaire | |
| 5,151,039 A | 9/1992 | Murphy | |
| 5,157,475 A | 10/1992 | Yamaguchi | |
| 5,157,480 A | 10/1992 | McShane | |
| 5,166,992 A | 11/1992 | Cassidy et al. | |
| 5,168,368 A | 12/1992 | Gow | |
| 5,172,213 A | 12/1992 | Zimmerman | |
| 5,172,214 A | 12/1992 | Casto | |
| 5,175,060 A | 12/1992 | Enomoto et al. | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,218,231 A | 6/1993 | Kudo | |
| 5,221,642 A | 6/1993 | Burns | |
| 5,250,841 A | 10/1993 | Sloan et al. | |
| 5,252,853 A | 10/1993 | Michii | |
| 5,258,094 A | 11/1993 | Furui et al. | |
| 5,266,834 A | 11/1993 | Nishi et al. | |
| 5,273,938 A | 12/1993 | Lin et al. | |
| 5,277,972 A | 1/1994 | Sakumoto | |
| 5,278,446 A | 1/1994 | Nagaraj et al. | |
| 5,279,029 A | 1/1994 | Burns | |
| 5,281,849 A | 1/1994 | Singh Deo | |
| 5,283,460 A | 2/1994 | Mita | |
| 5,285,352 A | 2/1994 | Pastore et al. | |
| 5,294,897 A | 3/1994 | Notani | |
| 5,327,008 A | 7/1994 | Djennas et al. | |
| 5,332,864 A | 7/1994 | Liang et al. | |
| 5,335,771 A | 8/1994 | Murphy | |
| 5,336,931 A | 8/1994 | Juskey | |
| 5,343,076 A | 8/1994 | Katayama et al. | |
| 5,358,905 A | 10/1994 | Chiu | |
| 5,365,106 A | 11/1994 | Watanabe | |
| 5,381,042 A | 1/1995 | Lerner | |
| 5,391,439 A | 2/1995 | Tomita et al. | |
| 5,406,124 A | 4/1995 | Morita et al. | |
| 5,410,180 A | 4/1995 | Fujii et al. | |
| 5,414,299 A | 5/1995 | Wang et al. | |
| 5,417,905 A | 5/1995 | Lemaire | |
| 5,424,576 A | 6/1995 | Djennas et al. | |
| 5,428,248 A | 6/1995 | Cha | |
| 5,435,057 A | 7/1995 | Bindra et al. | |
| 5,444,301 A | 8/1995 | Song | |
| 5,452,511 A | 9/1995 | Chang | |
| 5,454,905 A | 10/1995 | Fogelson | |
| 5,467,032 A | 11/1995 | Lee | |
| 5,474,958 A | 12/1995 | Djennas et al. | |
| 5,484,274 A | 1/1996 | Neu | |
| 5,493,151 A | 2/1996 | Asada et al. | |
| 5,508,556 A | 4/1996 | Lin | |
| 5,517,056 A | 5/1996 | Bigler et al. | |
| 5,521,429 A | 5/1996 | Aono | |
| 5,528,076 A | 6/1996 | Pavio | |
| 5,534,467 A | 7/1996 | Rostoker | |
| 5,539,251 A | 7/1996 | Iverson | |
| 5,543,657 A | 8/1996 | Diffenderfer | |
| 5,745,959 A | 5/1998 | Dodge | |
| 6,061,401 A | 5/2000 | Jung | |
| 6,092,076 A | 7/2000 | McDonough et al. | |
| 6,139,555 A | 10/2000 | Hart | |
| 6,140,563 A | 10/2000 | Mousel | |
| 6,198,171 B1 | 3/2001 | Huang | |
| 6,201,186 B1 | 3/2001 | Daniels et al. | |
| 6,201,292 B1 | 3/2001 | Yagi et al. | |
| 6,204,554 B1 | 3/2001 | Ewer | |
| 6,208,020 B1 | 3/2001 | Minamio et al. | |
| 6,208,021 B1 | 3/2001 | Ohuchi et al. | |
| 6,208,023 B1 | 3/2001 | Nakayama et al. | |
| 6,211,462 B1 | 4/2001 | Carter, Jr. | |
| 6,218,731 B1 | 4/2001 | Huang et al. | |
| 6,222,258 B1 | 4/2001 | Asano et al. | |
| 6,222,259 B1 | 4/2001 | Park | |
| 6,225,146 B1 | 5/2001 | Yamaguchi et al. | |
| 6,229,200 B1 | 5/2001 | Mclellan | |
| 6,229,205 B1 | 5/2001 | Jeong | |
| 6,239,366 B1 * | 5/2001 | Hsuan et al. | 174/529 |
| 6,239,367 B1 | 5/2001 | Hsuan | |
| 6,239,384 B1 | 5/2001 | Smith | |
| 6,242,281 B1 | 6/2001 | Mclellan et al. | |
| 6,256,200 B1 | 7/2001 | Lam et al. | |
| 6,258,629 B1 | 7/2001 | Niones et al. | |
| 6,260,532 B1 | 7/2001 | Mendler | |
| 6,281,566 B1 | 8/2001 | Magni | |
| 6,281,568 B1 | 8/2001 | Glenn et al. | |
| 6,282,095 B1 | 8/2001 | Houghton | |
| 6,285,075 B1 | 9/2001 | Combs | |
| 6,291,271 B1 | 9/2001 | Lee | |
| 6,291,273 B1 | 9/2001 | Miyaki et al. | |
| 6,294,100 B1 | 9/2001 | Fan | |
| 6,294,830 B1 | 9/2001 | Fjelstad | |
| 6,295,977 B1 | 10/2001 | Ripper et al. | |
| 6,297,548 B1 | 10/2001 | Moden et al. | |
| 6,303,984 B1 | 10/2001 | Corisis | |
| 6,303,997 B1 | 10/2001 | Lee | |
| 6,307,272 B1 | 10/2001 | Takahashi | |
| 6,309,909 B1 | 10/2001 | Ohgiyama | |
| 6,316,822 B1 | 11/2001 | Venkateshwaran | |
| 6,316,838 B1 | 11/2001 | Ozawa et al. | |
| 6,323,550 B1 | 11/2001 | Martin | |
| 6,326,243 B1 | 12/2001 | Suzuya et al. | |
| 6,326,244 B1 | 12/2001 | Brooks | |
| 6,326,678 B1 | 12/2001 | Karnezos et al. | |
| 6,333,854 B1 | 12/2001 | Sasaoka et al. | |
| 6,335,564 B1 | 1/2002 | Pour | |
| 6,337,510 B1 | 1/2002 | Chun-Jen et al. | |
| 6,339,255 B1 | 1/2002 | Shin | |
| 6,348,726 B1 | 2/2002 | Bayan | |
| 6,355,502 B1 | 3/2002 | Kang et al. | |
| 6,359,221 B1 | 3/2002 | Yamada et al. | |
| 6,362,525 B1 | 3/2002 | Rahim | |

(56) References Cited

U.S. PATENT DOCUMENTS

| | | |
|---|---|---|
| 6,369,447 B2 | 4/2002 | Mori |
| 6,369,454 B1 | 4/2002 | Chung |
| 6,373,127 B1 | 4/2002 | Baudouin et al. |
| 6,377,464 B1 | 4/2002 | Hashemi et al. |
| 6,380,048 B1 | 4/2002 | Boon et al. |
| 6,384,472 B1 | 5/2002 | Huang |
| 6,388,336 B1 | 5/2002 | Venkateshwaran |
| 6,395,578 B1 | 5/2002 | Shin et al. |
| 6,399,415 B1 | 6/2002 | Bayan et al. |
| 6,400,004 B1 | 6/2002 | Fan et al. |
| 6,410,979 B2 | 6/2002 | Abe |
| 6,414,385 B1 | 7/2002 | Huang |
| 6,420,779 B1 | 7/2002 | Sharma et al. |
| 6,421,013 B1 | 7/2002 | Chung |
| 6,429,508 B1 | 8/2002 | Gang |
| 6,437,429 B1 | 8/2002 | Su et al. |
| 6,444,499 B1 | 9/2002 | Swiss |
| 6,448,633 B1 | 9/2002 | Yee et al. |
| 6,452,279 B2 | 9/2002 | Shimoda |
| 6,459,148 B1 | 10/2002 | Chun-Jen et al. |
| 6,464,121 B2 | 10/2002 | Reijnders |
| 6,465,883 B2 | 10/2002 | Olofsson |
| 6,472,735 B2 | 10/2002 | Isaak |
| 6,475,646 B2 | 11/2002 | Park et al. |
| 6,476,469 B2 | 11/2002 | Hung et al. |
| 6,476,474 B1 | 11/2002 | Hung |
| 6,482,680 B1 | 11/2002 | Khor |
| 6,483,178 B1 | 11/2002 | Chuang |
| 6,492,718 B2 | 12/2002 | Ohmori |
| 6,498,099 B1 | 12/2002 | McLellan |
| 6,498,392 B2 | 12/2002 | Azuma |
| 6,507,096 B2 | 1/2003 | Gang |
| 6,507,120 B2 | 1/2003 | Lo |
| 6,518,089 B2 | 2/2003 | Coyle |
| 6,534,849 B1 | 3/2003 | Gang |
| 6,545,332 B2 | 4/2003 | Huang |
| 6,545,345 B1 | 4/2003 | Glenn et al. |
| 6,552,421 B2 | 4/2003 | Kishimoto et al. |
| 6,559,525 B2 | 5/2003 | Huang |
| 6,566,168 B2 | 5/2003 | Gang |
| 6,580,161 B2 | 6/2003 | Kobayakawa |
| 6,583,503 B2 | 6/2003 | Akram |
| 6,603,196 B2 | 8/2003 | Lee |
| 6,624,005 B1 | 9/2003 | DiCaprio |
| 6,646,339 B1 | 11/2003 | Ku |
| 6,667,546 B2 | 12/2003 | Huang et al. |
| 6,677,663 B1 | 1/2004 | Ku |
| 6,686,649 B1 | 2/2004 | Mathews et al. |
| 6,696,752 B2 | 2/2004 | Su |
| 6,700,189 B2 | 3/2004 | Shibata |
| 6,713,375 B2 | 3/2004 | Shenoy |
| 6,757,178 B2 | 6/2004 | Okabe |
| 6,800,936 B2 | 10/2004 | Kosemura et al. |
| 6,812,552 B2 | 11/2004 | Islam et al. |
| 6,858,919 B2 | 2/2005 | Seo et al. |
| 6,867,492 B2 | 3/2005 | Auburger et al. |
| 6,878,571 B2 | 4/2005 | Isaak et al. |
| 6,897,552 B2 | 5/2005 | Nakao |
| 6,927,478 B2 | 8/2005 | Paek |
| 7,002,805 B2 | 2/2006 | Lee et al. |
| 7,005,327 B2 | 2/2006 | Kung |
| 7,015,571 B2 | 3/2006 | Chang |
| 7,053,469 B2 | 5/2006 | Koh et al. |
| 7,102,209 B1 | 9/2006 | Bayan et al. |
| 7,185,426 B1 | 3/2007 | Hiner et al. |
| 7,297,344 B1 | 11/2007 | Fleischer |
| 7,312,405 B2 | 12/2007 | Hsu |
| 7,687,899 B1 | 3/2010 | Berry |
| 2001/0014538 A1 | 8/2001 | Kwan et al. |
| 2002/0024122 A1 | 2/2002 | Jung |
| 2002/0027297 A1 | 3/2002 | Ikenaga et al. |
| 2002/0038873 A1 | 4/2002 | Hiyoshi |
| 2002/0111009 A1 | 8/2002 | Huang et al. |
| 2002/0140061 A1 | 10/2002 | Lee |
| 2002/0140068 A1 | 10/2002 | Lee |
| 2002/0140081 A1 | 10/2002 | Chou et al. |
| 2002/0163015 A1 | 11/2002 | Lee et al. |
| 2002/0167060 A1 | 11/2002 | Buijsman et al. |
| 2003/0006055 A1 | 1/2003 | Chien-Hung et al. |
| 2003/0059644 A1 | 3/2003 | Datta et al. |
| 2003/0064548 A1 | 4/2003 | Isaak |
| 2003/0073265 A1 | 4/2003 | Hu et al. |
| 2003/0102537 A1 | 6/2003 | McLellan |
| 2003/0164554 A1 | 9/2003 | Fee et al. |
| 2003/0168719 A1 | 9/2003 | Cheng et al. |
| 2003/0198032 A1 | 10/2003 | Collander et al. |
| 2004/0027788 A1 | 2/2004 | Chiu |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0065963 A1 | 4/2004 | Karnezos |
| 2004/0080025 A1 | 4/2004 | Kasahara |
| 2004/0089926 A1 | 5/2004 | Hsu et al. |
| 2004/0089943 A1 | 5/2004 | Kirigaya |
| 2004/0164387 A1 | 8/2004 | Ikenaga et al. |
| 2006/0087020 A1 | 4/2006 | Hirano et al. |
| 2006/0157843 A1 | 7/2006 | Hwang |
| 2006/0231939 A1 | 10/2006 | Kawabata et al. |
| 2007/0108583 A1 | 5/2007 | Shim et al. |
| 2007/0216006 A1 | 9/2007 | Park et al. |
| 2007/0216008 A1 | 9/2007 | Gerber |
| 2007/0289777 A1 | 12/2007 | Pendse |
| 2007/0290319 A1 | 12/2007 | Kim |
| 2008/0006942 A1 | 1/2008 | Park et al. |
| 2008/0017967 A1 | 1/2008 | Bauer et al. |
| 2008/0029858 A1 | 2/2008 | Merilo et al. |
| 2008/0029884 A1 | 2/2008 | Grafe et al. |
| 2008/0283992 A1 | 11/2008 | Palaniappan et al. |
| 2009/0014851 A1* | 1/2009 | Choi et al. ............ 257/676 |

FOREIGN PATENT DOCUMENTS

| | | |
|---|---|---|
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 A2 | 3/2000 |
| EP | EP1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |

(56) References Cited

FOREIGN PATENT DOCUMENTS

| | | |
|---|---|---|
| JP | 692076 | 4/1994 |
| JP | 6140563 | 5/1994 |
| JP | 6260532 | 9/1994 |
| JP | 7297344 | 11/1995 |
| JP | 7312405 | 11/1995 |
| JP | 8064364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 09293822 | 11/1997 |
| JP | 10022447 | 1/1998 |
| JP | 10199934 | 7/1998 |
| JP | 10256240 | 9/1998 |
| JP | 11307675 | 11/1999 |
| JP | 2000150765 | 5/2000 |
| JP | 2001060648 | 3/2001 |
| JP | 2002043497 | 2/2002 |
| JP | 2002519848 | 7/2002 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002. (see pp. 24-26 of attachment NPLdocs).

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml (see pp. 27-31of attachment NPLdocs).

* cited by examiner

SEMICONDUCTOR DEVICE INCLUDING LEADFRAME WITH DOWNSETS

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to integrated circuit package technology and, more particularly, to an increased capacity semiconductor device or package (e.g., a quad flat pack or QFP semiconductor package) which includes a uniquely configured leadframe adapted to provide various efficiencies and economies in the manufacturing process for the semiconductor package.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component. In certain semiconductor packages, a portion of the die pad of the leadframe also remains exposed within the package body. Exemplary semiconductor packages or devices employing leadframes include a through-hole mounting dual type inline package (DIP), a surface mounting type quad flat package (QFP), and a small outline package (SOP).

As indicated above, one type of semiconductor package commonly including a leadframe is a quad flat pack (QFP) package. QFP semiconductor packages or devices are particularly advantageous for their smaller size and superior electrical performance. A typical QFP package comprises a thin, generally square package body defining four peripheral sides of substantially equal length. Protruding from each of the four peripheral sides of the package body are a plurality of leads which each have a generally gull-wing configuration. Portions of the leads are internal to the package body, and are electrically connected to respective ones of the pads or terminals of a semiconductor die also encapsulated within the package body. The semiconductor die is itself mounted to a die paddle or die pad of the QFP package leadframe. In certain types of QFP packages referred to as QFP exposed pad packages, one surface of the die pad is exposed within the bottom surface of the package body. When the leadframe is in its original, unsingulated state, both the leads and the die pad are typically attached to a peripheral dambar, with the attachment of the die pad to the dambar often being facilitated by multiple tie bars which protrude from the die pad.

In those leadframes having the above-described structural attributes, a downset is typically formed in each of the tie bars that results in the die pad and at least portions of the leads residing on respective ones of spaced, generally parallel planes. The downsets in the tie bars are typically formed in close proximity to the die pad. The positioning of the die pad relative to the leads attributable to the inclusion of the downsets and the tie bars is often selected to ensure that the semiconductor die mounted to the die pad is fully covered by the encapsulant material which is ultimately applied thereto and hardens into the package body of the semiconductor package. In addition to ensuring that the semiconductor die is completely covered by the encapsulant material, the position of the die pad relative to the leads resulting from the inclusion of the downsets in the tie bars is also selected to ensure that the wire bonds used to facilitate the electrical connection of the semiconductor die to the leads are also fully covered by the encapsulant material applied thereto.

In the manufacturing process for a semiconductor package such as a QFP package including a leadframe having the above-described structural attributes, the leadframe is typically mounted on a heat block for wire bonding. In this stage of the manufacturing process, a recess having a predetermined depth in which the downsets of the tie bars and the die pad are mounted is formed in the heat block. Stated another way, a recess having a predetermined depth is formed in the heat block to allow the die pad of the leadframe to be mounted and seated therein.

However, one of the drawbacks in the design of the above-described leadframes is attributable to the proximity which must normally be maintained between the inner ends or tips of the leads and the peripheral edge of the die pad. In this regard, if the inner ends or tips of the leads are positioned too close to the die pad, such leads are typically not seated in a stable manner in the recess of the heat block, but rather remain unsupported in such recess, thus causing severe bouncing during the wire bonding process and often resulting in poor wire bonding efficiency. Though this particular problem is lessened by positioning the inner ends or tips of the leads further from the die pad, such increased separation necessitates an undesirable increase in the length of those wires used in the wire bonding process to facilitate the electrical connection of the semiconductor die to the leads. The present invention provides a leadframe which is suitable for integration into a semiconductor device or package such as a QFP package and addresses many of the aforementioned shortcomings. Among other things, the leadframe of the present invention is adapted to provide various efficiencies and economies in the manufacturing process for a semiconductor package including the same. These, as well as other features and attributes of the present invention, will be discussed in more detail below.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
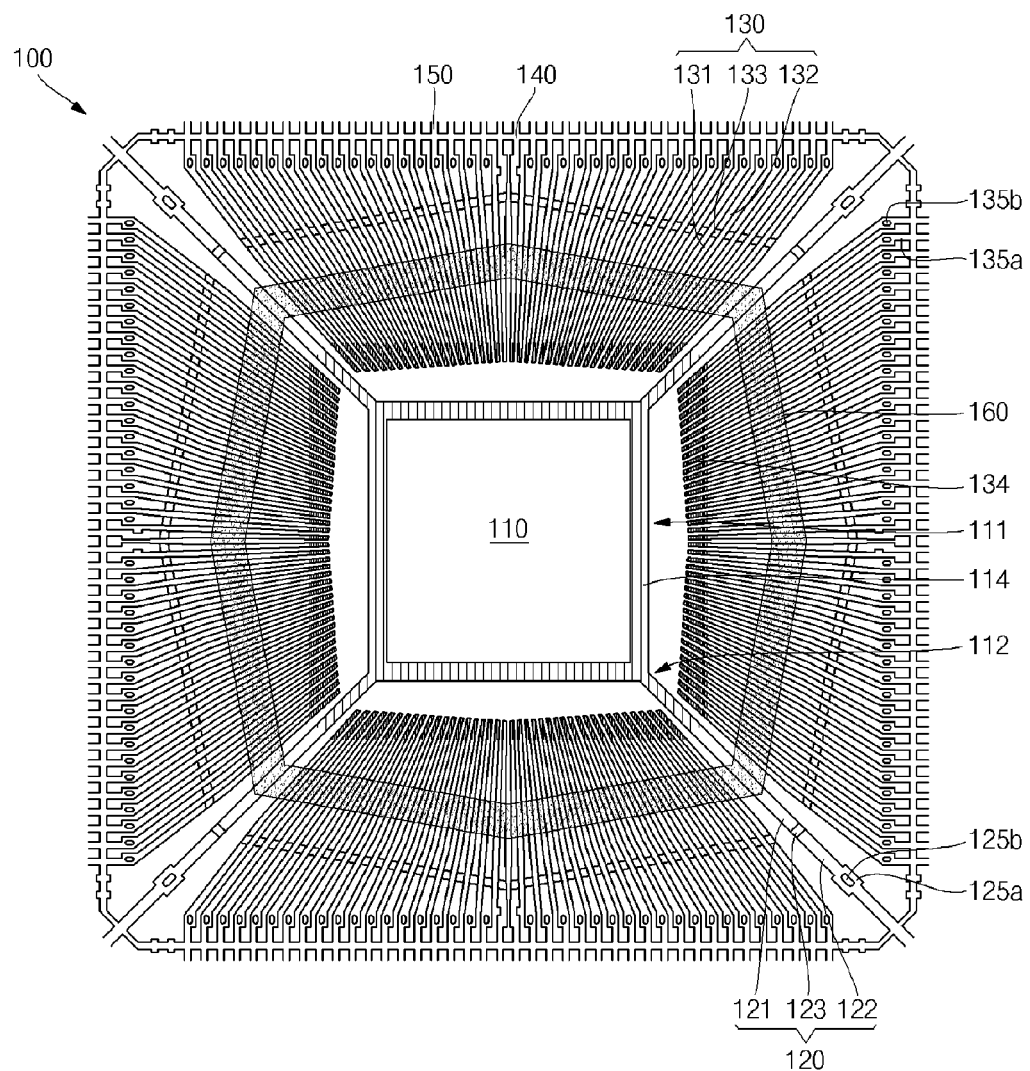
FIG. 1 is a top plan view of a first embodiment of an unsingulated leadframe which may integrated into a semiconductor package constructed in accordance with the present invention, further depicting a tape layer which may be applied to the leadframe.
Figure 1A:
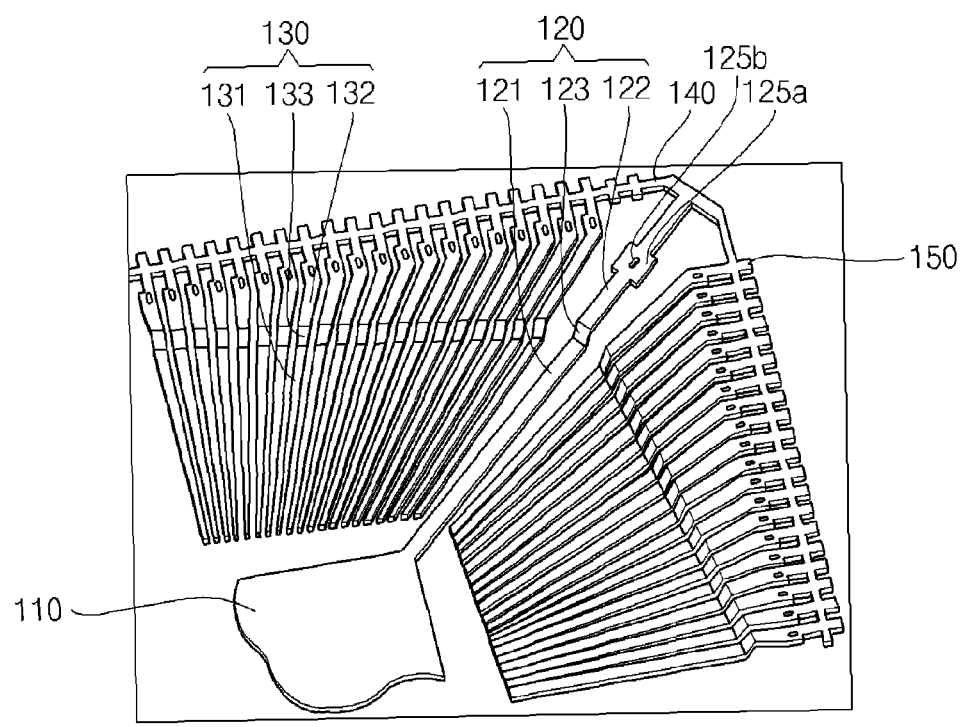
FIG. 1A is a partial top perspective view of the leadframe shown in FIG. 1.

Referring now to the drawings wherein the showings are for purposes of illustrating preferred embodiments of the present invention only, and not for purposes of limiting the same, FIGS. 1 and 1A depict a leadframe 100 which is constructed in accordance with a first embodiment of the present invention. The leadframe 100 is adapted for integration into a semiconductor device or semiconductor package, including the semiconductor packages 200, 300, 400, 500 which are shown in respective ones of FIGS. 9-12, and will be described in more detail below.

The leadframe 100 of the present invention comprises a generally quadrangular (e.g., square) die pad 110 which defines four peripheral edge segments 111 and four corner regions 112. Integrally connected to the die pad 110 is a plurality of tie bars 120. More particularly, the leadframe 100 includes four tie bars 120 which extend diagonally from respective ones of the four corner regions 112 defined by the die pad 110. Each of the tie bars 120 is integrally connected to a peripheral dambar 140 of the leadframe 100. As such, as is seen in FIG. 1, the die pad 110 is circumvented by the dambar 140. The dambar 140 itself has a generally quadrangular (e.g., square) configuration.

As is best seen in FIG. 1A, each of the tie bars 120 is bent to include a downset 123 therein, the downset 123 being located between the die pad 110 and the dambar 140. Due to the inclusion of the downset 123 therein, each of the tie bars 120 defines a first tie bar region 121 which is disposed between the die pad 110 and the downset 123 and extends in generally co-planar relation to the die pad 110, and a second tie bar region 122 which extends between the downset 123 and the dambar 140 and resides on a plane which is elevated above that of the die pad 110. Stated another way, the die pad 110 and the first tie bar regions 121 of the tie bars 120 reside on a first plane, with the second tie bar regions 122 of the tie bars 120 and the dambar 140 each residing on a second plane which is disposed in spaced, generally parallel relation to the first plane.

As is further apparent from FIGS. 1 and 1A, the first tie bar region 121 of each tie bar 120 is of a length exceeding that of the second tie bar region 122 thereof. In other words, the second tie bar region 122 of each tie bar 120 is shorter than the corresponding first tie bar region 121 thereof. Additionally, the second tie bar region 122 of each tie bar 120 is preferably formed to define a locking projection 125*a* having an aperture 125*b* extending through the approximate center thereof. During the fabrication process for a semiconductor device or package including the leadframe 100, the encapsulant material used to form the package body of the semiconductor package is able to flow over the locking projection 125*a* of each of the tie bars 120, and through the locking aperture 125*b* thereof, thus improving the bonding or mechanical interlock between the package body of the semiconductor package and those portions of the tie bars 120 covered or encapsulated thereby.

As indicated above, the tie bars 120 of the leadframe 100 are integrally connected to the dambar 140 which circumvents the die pad 110. As also indicated above, the dambar 140 is provided in the form of a substantially quadrangular ring which interconnects the distal ends of the tie bars 120, thus resulting in the dambar 140 extending in generally co-planar relation to the second tie bar regions 122 of the tie bars 120. As seen in FIG. 1, the dambar 140 defines four peripheral edge segments which extend in spaced, generally parallel relation to respective ones of the peripheral edge segments 111 defined by the die pad 110. In the fabrication process for the semiconductor package including the leadframe 100, the dambar 140 is singulated or removed from the leadframe 100 to electrically isolate various structural features of the leadframe 100 from each other, as will be described in more detail below.

The leadframe 100 further comprises a plurality of inner leads 130 which are integrally connected to the dambar 140 and extend inwardly therefrom toward the die pad 110. More particularly, the inner leads 130 are segregated into four sets, with the inner leads 130 of each set being integrally connected to and extending inwardly from a respective one of the four peripheral edge segments defined by the dambar 140 toward a corresponding one of the four peripheral edge segments 111 defined by the die pad 110. The inner leads 130 of each set are also arranged at a predetermined pitch and are each of a predetermined length.

In the leadframe 100, each of the inner leads 130 is bent to include a downset 133 therein. Due to the inclusion of the downset 133 therein, each of the inner leads 130 includes a first inner lead region 131 which is disposed between the die pad 110 and the downset 133 and extends in generally co-planar relation to the die pad 110, and a second inner lead region 132 which extends between the downset 133 and the dambar 140 and resides on a plane which is elevated above that of the die pad 110 and the corresponding first inner lead region 131. Thus, the die pad 110, the first tie bar regions 121 of the tie bars 120 and the first inner lead regions 131 of the inner leads 130 reside on a first plane, with the second tie bar regions 122, the second inner lead regions 132 and the dambar 140 each residing on a second plane which is disposed in spaced, generally parallel relation to the first plane.

As is also apparent from FIGS. 1 and 1A, the first inner lead region 131 of each inner lead 130 is longer than the second inner lead region 132 thereof. In addition, within each set of the inner leads 130, the lengths of the second inner lead regions 132 gradually decrease as the inner leads 130 are oriented closer toward the center of the adjacent, corresponding peripheral edge segment 111 of the die pad 110. More particularly, each set of the inner leads 130 extends between a corresponding pair of the tie bars 120, toward a corresponding peripheral edge segment 111 of the die pad 110. The second inner lead regions 132 of the outermost pair of the inner leads 130 of the set (which are disposed closest to the tie bars 120) are of the greatest length, with the second inner lead regions 132 of the adjacent pair of the inner leads 130 which is aligned with the approximate center of the corresponding peripheral edge segment 111 of the die pad 110 being of the shortest length. In addition, as is also apparent from FIG. 1, the distance separating the tips of first inner lead regions 131 of the inner leads 130 of the same set from the corresponding peripheral edge segment 111 of the die pad 110 gradually increases as the inner leads 130 move from the tie bars 120 of the corresponding pair toward the center of such corresponding peripheral edge segment 111 of the die pad 110.

In the leadframe 100, the second inner lead region 132 of each inner lead 130 is preferably formed to define a locking projection 135a having an aperture 135b extending through the approximate center thereof. During the fabrication process for a semiconductor device or package including the leadframe 100, the encapsulant material used to form the package body of the semiconductor package is also able to flow over the locking projection 135a of each of the inner leads 130, and through the locking aperture 135b thereof, thus improving the bonding or mechanical interlock between the package body of the semiconductor package and those portions of the inner leads 130 covered or encapsulated thereby.

The leadframe 100 constructed in accordance with the present invention further comprises a plurality of outer leads 150 which are integrally connected to the dambar 140. The outer leads 150, like the inner leads 130, are preferably segregated into four sets, with each set of the outer leads 150 extending between an adjacent pair of the tie bars 120. The outer leads 150 of each set also extend generally perpendicularly relative to a respective one of the peripheral edge segments of the dambar 140 at a predetermined length, the outer leads 150 of each set also being arranged at a predetermined pitch. Additionally, as best seen in FIG. 1, each outer lead 150 is preferably aligned with the locking projection 135a within the second inner lead region 132 of a corresponding inner lead 130. However, each outer lead is separated from the second inner lead region 132 of the corresponding inner lead 130 by the dambar 140.

Based on the structural attributes of the leadframe 100 as described above, the die pad 110, the first tie bar regions 121 of the tie bars 120 and the first inner lead regions 131 of the inner leads 130 reside on a first plane, with the second tie bar regions 122 of the tie bars 120, the second inner lead regions 132 of the inner leads 130, the dambar 140 and the outer leads 150 each residing on a second plane which is disposed in spaced, generally parallel relation to the first plane. Additionally, during the process of fabricating a semiconductor package including the leadframe 100, the singulation or removal of the dambar 140 from the leadframe 100 is preferably completed in manner wherein each of the inner leads 130 is integrally connected to that outer lead 150 of the corresponding set which is aligned therewith, though each joined pair of inner and outer leads 130, 150 is electrically isolated from every other joined pair thereof as well as the die pad 110 and tie bars 120. However, even after the singulation of the dambar 140, the integral connection between the tie bars 120 and the die pad 110 is maintained. In a semiconductor package including the leadframe 100 having the dambar 140 removed therefrom in the aforementioned manner, each joined pair of inner and outer leads 130, 150 provides a common electrical path, the outer leads 150 further providing a modality to electrically connect the semiconductor package to an external device.

It is contemplated that the leadframe 100 of the present invention may be made of a copper series material (e.g., Cu:Fe:P=99.8:0.01:0.025), a copper alloy series material (e.g., Cu:Cr:Sn:Zn=99:0.25:0.25:0.22), an alloy 42 series material (e.g., Fe:Ni=58:42), and equivalents thereof. However, those of ordinary skill in the art will recognize that the present invention is not intended to be limited to any specific material for the leadframe 100.

In FIG. 1, the leadframe 100 is depicted as having a ring-shape segment of lead locking tape 160 adhered to the top surface thereof, and more particularly to the top surfaces of the first inner lead regions 131 of the inner leads 130. The lead locking tape 160 allows the inner leads 130, and in particular the first inner lead regions 131 thereof, to be positioned at the same height and to be spaced at a predetermined distance apart from each other. Additionally, when viewed from the perspective shown in FIG. 1, the lead locking tape 160 is also adhered to the top surfaces of the tie bars 120, and in particular the top surfaces of the first tie bar regions 121 thereof. The lead locking tape 160 is an optional element of the leadframe 100 and any semiconductor package fabricated to include the same. Additionally, the shape of the lead locking tape 160 shown in FIG. 1 is exemplary only, in that the lead locking tape 160 may consist of separate segments rather than a continuous quadrangular frame as depicted. As indicated above, the lead locking tape 160, if included in the leadframe 100, is used to prevent the inner leads 130 from undergoing any deformation or variation in position during the fabrication process related to the semiconductor package including the leadframe 100.

As further shown in FIG. 1, it is contemplated that the leadframe 100 may include a plating region 114 which is formed on the periphery of the top surface of the die pad 110, and extends to each of the peripheral edge segments 111 thereof. In addition to the plating region 114 of the die pad 110, a portion of the top surface of the first inner lead region 131 of each inner lead 130 may be provided with a plating region 134 which extends to the end thereof disposed closest to the die pad 110. Thus, it is the top surface of the first inner lead portion 131 of each of the inner leads 130 which defines the wire bonding area thereof. In this regard, the plating regions 114, 134 allow conductive wires to be more effectively bonded to both the die pad 110 and the first inner lead regions 131 of the inner leads during the process of manufacturing a semiconductor device or package including the leadframe 100. The plating regions 114, 134 may be made of gold (Au), silver (Ag), nickel (Ni), palladium (Pd), solder, and equivalents thereof. However, those of ordinary skill in the art will recognize that the present invention is not intended to be limited to any specific material for the plating regions 114, 134. Alternatively, the leadframe 100 may a pre-plated leadframe (PPF) to provide enhance wire bonding areas. Additionally, it should be noted that neither the lead locking tape 160 or plating regions 114, 134 are depicted in FIG. 1A.

Those or ordinary skill in the art will recognize that the number of inner leads 130 and outer leads 150 shown in FIG. 1 is for illustrative purposes only, and may be modified according to application field. Additionally, though the inner leads 130 and outer leads 150 are each shown as each being segregated into four sets, it will be recognized that fewer sets of the inner leads 130 and outer leads 150 may be provided, and may be arranged along any combination of two or three of the peripheral edge segments 111 of the die pad 110. Moreover, less than four tie bars 120 may be included in the leadframe 100, extending to respective corners of the die pad 110 in any combination. It is further contemplated that the leadframe 100 may be fabricated through the implementation of a chemical etching process or alternatively a mechanical stamping process.

Figure 2:
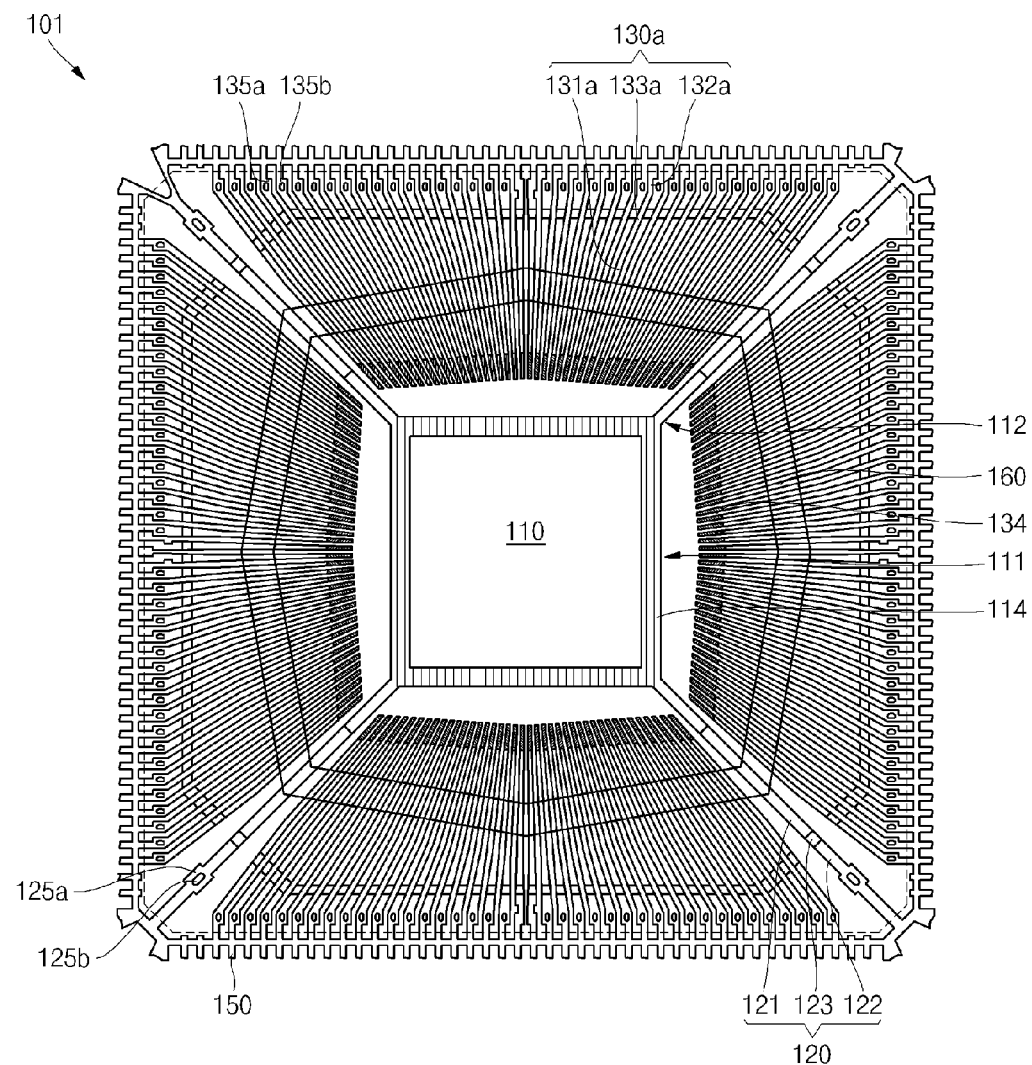
FIG. 2 is a top plan view of a second embodiment of an unsingulated leadframe which may integrated into a semiconductor package constructed in accordance with the present invention, further depicting a tape layer which may be applied to the leadframe.

Referring now to FIG. 2, there is shown a leadframe 101 constructed in accordance with a second embodiment of the present invention. The leadframe 101 bears substantial structural similarity to the above-described leadframe 100, with only the distinctions between the leadframes 100, 101 being described below.

The sole distinction between the leadframes 100, 101 lies in the structural features of the inner leads 130a of the leadframe 101 in comparison to the inner leads 130 of the leadframe 100. In the leadframe 101, each of the inner leads 130a is bent to include a downset 133a therein. Due to the inclusion of the downset 133a therein, each of the inner leads 130a includes a first inner lead region 131a which is disposed between the die pad 110 and the downset 133a and extends in generally co-planar relation to the die pad 110, and a second inner lead region 132a which extends between the downset 133a and the dambar 140 and resides on a plane which is elevated above that of the die pad 110 and the corresponding first inner lead region 131a. Thus, the die pad 110, the first tie bar regions 121 of the tie bars 120 and the first inner lead regions 131a of the inner leads 130a reside on a first plane, with the second tie bar regions 122, the second inner lead regions 132a and the dambar 140 each residing on a second plane which is disposed in spaced, generally parallel relation to the first plane.

As is also apparent from FIG. 2, the first inner lead region 131a of each inner lead 130a is longer than the second inner lead region 132a thereof. In addition, within each of the four sets of the inner leads 130a, the lengths of the second inner lead regions 131a gradually decrease as the inner leads 130a move away from that pair of the tie bars 120 between which such set of inner leads 130a is positioned, and toward each of the opposed ends of the adjacent, corresponding peripheral edge segment 111 of the die pad 110. More particularly, each set of the inner leads 130a extends between a corresponding pair of the tie bars 120, toward a corresponding peripheral edge segment 111 of the die pad 110. The second inner lead regions 132a of the outermost groups of about six or seven inner leads 130a each of the set (which are disposed closest to the tie bars 120) are of gradually decreasing length, with the lengths of the second inner regions 132a of the remaining inner leads 130a of the set disposed between the outermost groups being of substantially equal length. As further seen in FIG. 2, the downsets 133a of the inner leads 130a included in each of the two outermost groups are substantially linearly aligned with the downset 123 of the adjacent tie bar 120. Forming the downsets 133a in the inner leads 130a in the orientations shown in FIG. 2 assists in avoiding undesirable deformation of the inner leads 130a.

Figure 3:
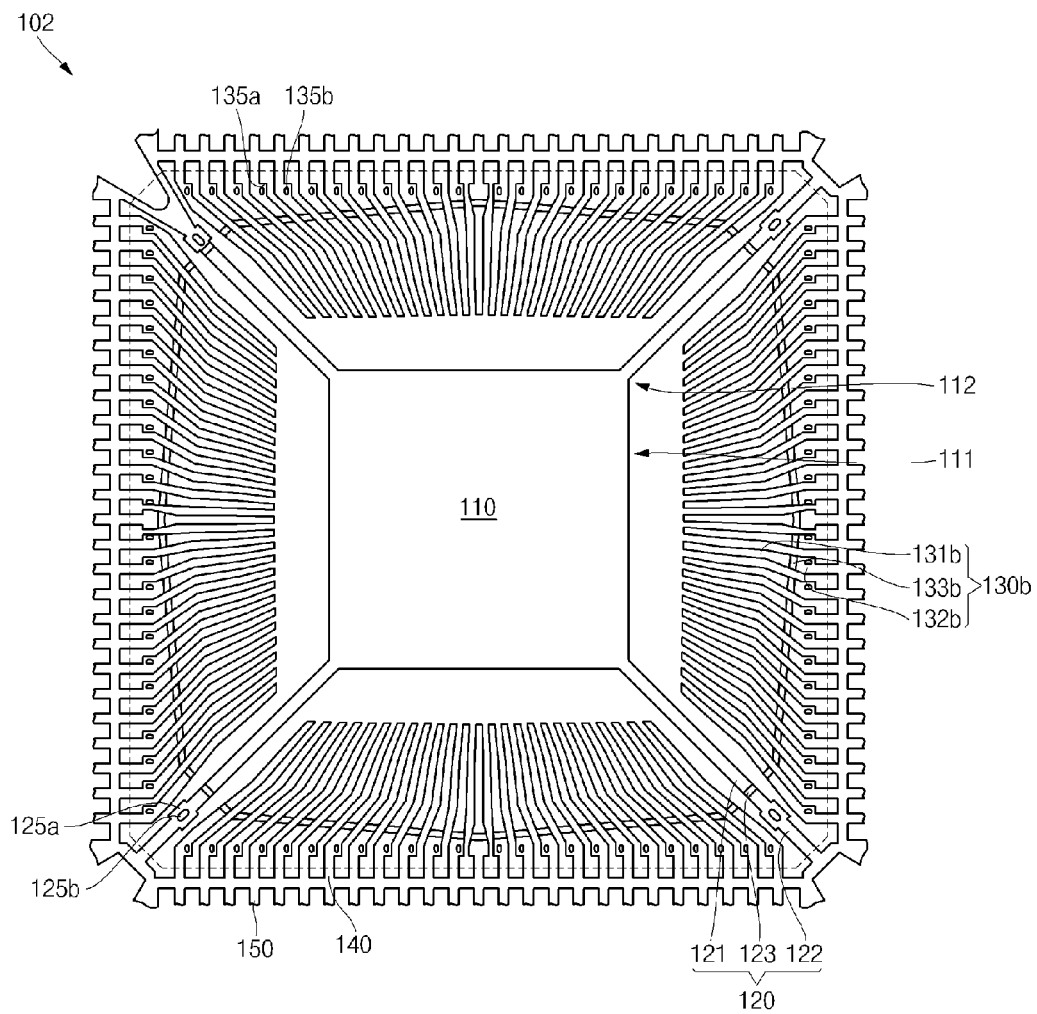
FIG. 3 is a top plan view of a third embodiment of an unsingulated leadframe which may be integrated into a semiconductor package constructed in accordance with the present invention.

Referring now to FIG. 3, there is shown a leadframe 102 constructed in accordance with a third embodiment of the present invention. The leadframe 102 also bears substantial structural similarity to the above-described leadframe 100, with only the distinctions between the leadframes 100, 102 being described below.

The sole distinction between the leadframes 100, 102 lies in the number and structural features of the inner leads 130b of the leadframe 102 in comparison to the inner leads 130 of the leadframe 100. As is apparent from FIG. 3, the first inner lead region 131b of each inner lead 130b is longer than the second inner lead region 132b thereof. In addition, within each set of the inner leads 130b, the lengths of the second inner lead regions 132b gradually decrease as the inner leads 130b are oriented closer toward the center of the adjacent, corresponding peripheral edge segment 111 of the die pad 110. More particularly, each set of the inner leads 130b extends between a corresponding pair of the tie bars 120, toward a corresponding peripheral edge segment 111 of the die pad 110. The second inner lead regions 132b of the outermost pair of the inner leads 130b of the set (which are disposed closest to the tie bars 120) are of the greatest length, with the second inner lead region 132b of the single, center inner lead 130b which is aligned with the approximate center of the corresponding peripheral edge segment 111 of the die pad 110 being of the shortest length.

In the leadframe 102, the number of leads 130b included in each set allows for such set to define a single, center lead, in contrast to a center adjacent pair as in the leadframes 100, 101 described above. As further shown in FIG. 3, in the center lead 130b of each set included in the leadframe 102, the downset 133b thereof is actually formed in a bent or angled configuration, as opposed to be generally straight as in the remaining leads 130b of the same set. The formation of the downset 133b of the central lead 130b of each set in this manner minimizes potential damage to the leads 130b of each set which may otherwise occur during the process of forming the downsets 133b therein.

Figure 4:
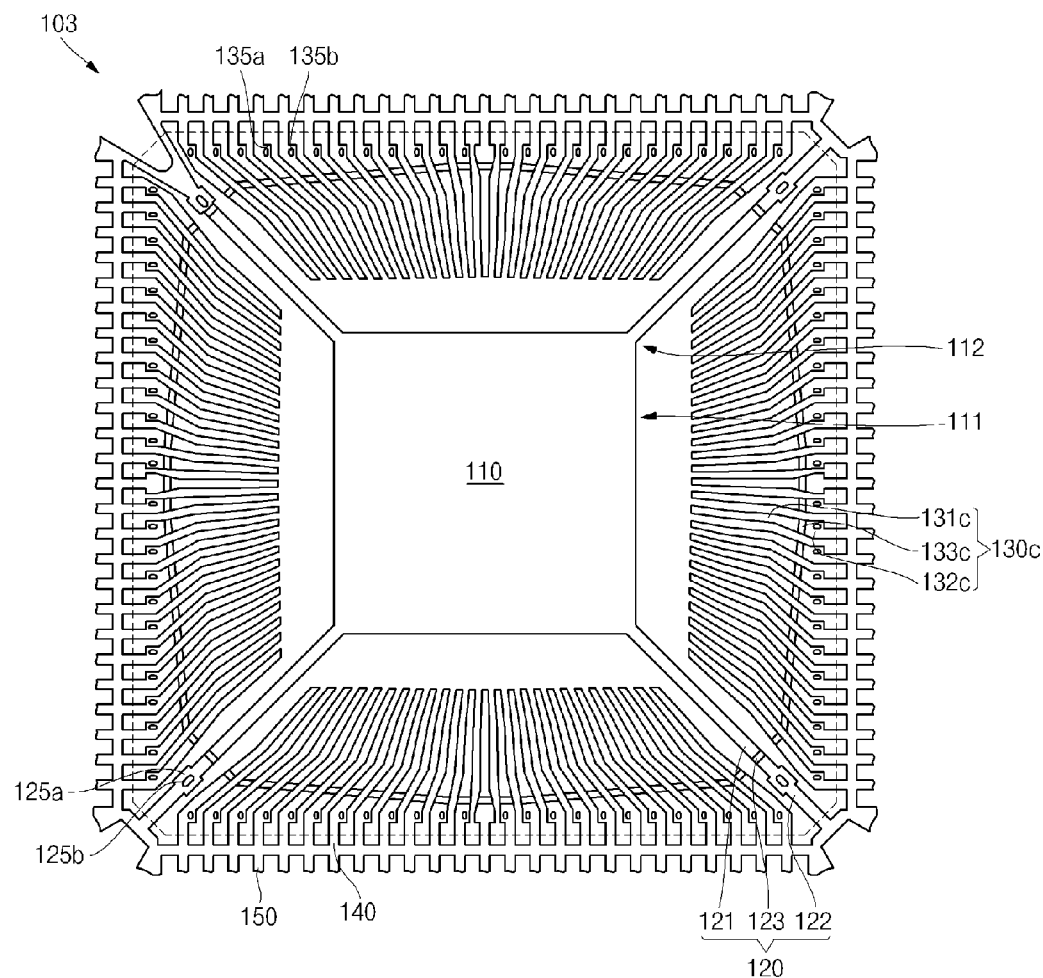
FIG. 4 is a top plan view of a fourth embodiment of an unsingulated leadframe which may be integrated into a semiconductor package constructed in accordance with the present invention.

Referring now to FIG. 4, there is shown a leadframe 103 constructed in accordance with a fourth embodiment of the present invention. The leadframe 103 bears substantial structural similarity to the above-described leadframe 102, with only the distinctions between the leadframes 102, 103 being described below.

The sole distinction between the leadframes 102, 103 lies in the structural features of the inner leads 130c of the leadframe 103 in comparison to the inner leads 130b of the leadframe 102. As is apparent from FIG. 4, the first inner lead region 131c of each inner lead 130c is longer than the second inner lead region 132c thereof. In addition, within each set of the inner leads 130c, the lengths of the second inner lead regions 132c gradually decrease as the inner leads 130c are oriented closer toward the center of the adjacent, corresponding peripheral edge segment 111 of the die pad 110. More particularly, each set of the inner leads 130c extends between a corresponding pair of the tie bars 120, toward a corresponding peripheral edge segment 111 of the die pad 110. The second inner lead regions 132c of the outermost pair of the inner leads 130c of the set (which are disposed closest to the tie bars 120) are of the greatest length, with the second inner lead region 132c of the single, center inner lead 130c which is aligned with the approximate center of the corresponding peripheral edge segment 111 of the die pad 110 being of the shortest length.

In the leadframe 103, the number of leads 130c included in each set allows for such set to define a single, center lead, in contrast to a center adjacent pair as in the leadframes 100, 101 described above. As further shown in FIG. 4, in the center lead 130c of each set included in the leadframe 102, and those two leads 130c disposed adjacent thereto (i.e., along each of the opposed sides thereof), the downsets 133c of such leads 130c are each substantially parallel to the corresponding segment of the dambar 140, as well as the adjacent peripheral edge segment 111 of the die pad 110. The formation of the downsets 133c of the central three leads 130c of each set in this manner minimizes potential damage to the leads 130c of each set which may otherwise occur during the process of forming the downsets 133c therein.

Figure 5:
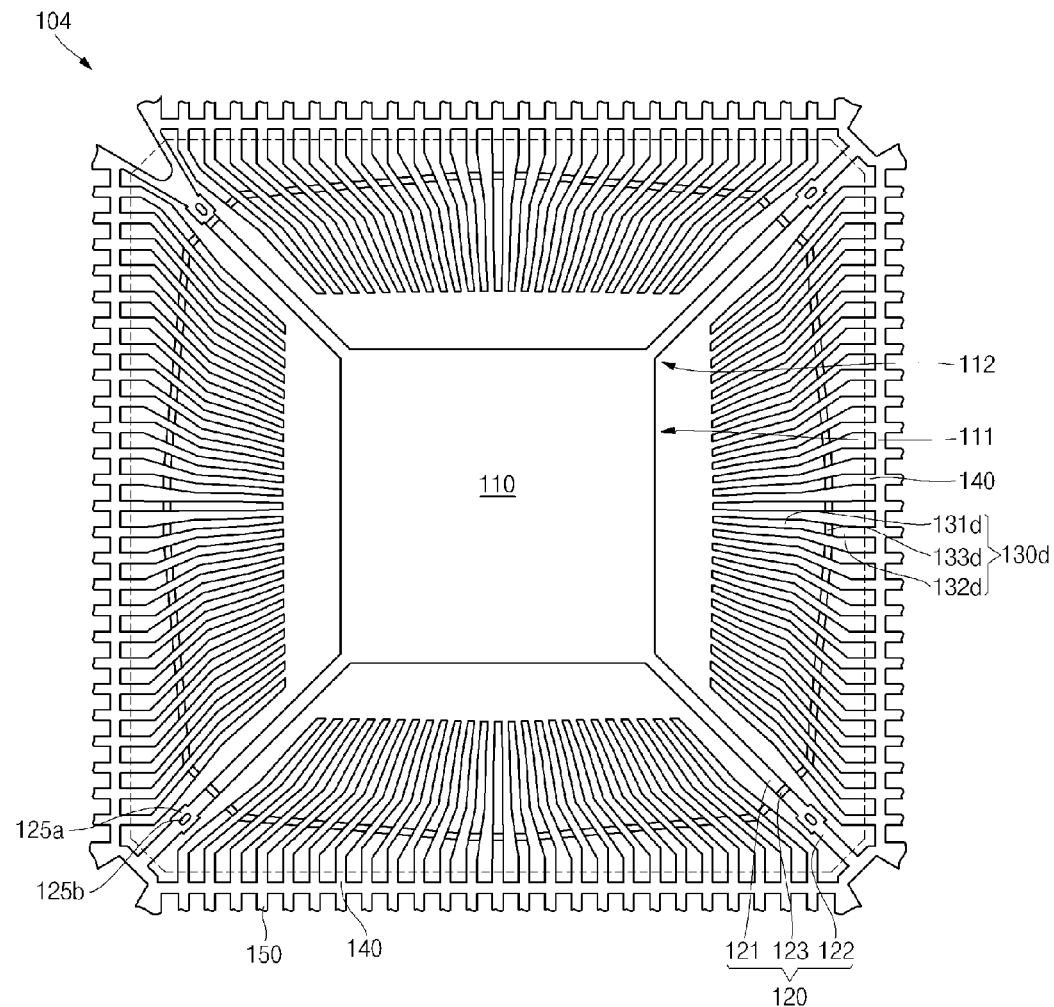
FIG. 5 is a top plan view of a fifth embodiment of an unsingulated leadframe which may be integrated into a semiconductor package constructed in accordance with the present invention.

Referring now to FIG. 5, there is shown a leadframe 104 constructed in accordance with a fifth embodiment of the present invention. The leadframe 104 bears substantial structural similarity to the above-described leadframe 103, with only the distinctions between the leadframes 103, 104 being described below.

The sole distinction between the leadframes 103, 104 lies in the structural features of the inner leads 130d and tie bars 120 of the leadframe 104 in comparison to the inner leads 130c and tie bars 120 of the leadframe 103. More particularly, as is apparent from FIG. 5, the inner leads 130d differ from the inner leads 130c by virtue of the omission of the locking projection 135a and the locking aperture 135b in each of the inner leads 130d. Similarly, the tie bars 120 of the leadframe 104 differ from those included in the leadframe 103 by virtue of the omission of the locking projection 125a and the locking aperture 125b in each of the tie bars 120 of the leadframe 104. The proximity of the downsets 133d, 123 to the dambar 140, and the ability of such downsets 133d, 123 to facilitate a firm mechanical interlock of the inner leads 130d and tie bars 120 to the package body of the semiconductor device when covered by the encapsulant material which ultimately hardens into the package body, avoids the need for the locking projections 125a, 135a, and the locking apertures 125b, 135b.

Figure 6:
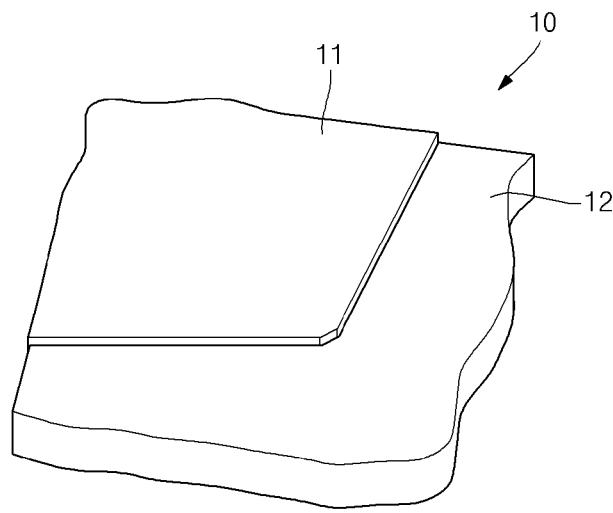
FIG. 6 is a partial top perspective view of a heat block which may be used in the fabrication process for a semiconductor package including a leadframe constructed in accordance with any embodiment of the present invention.
Figure 8:
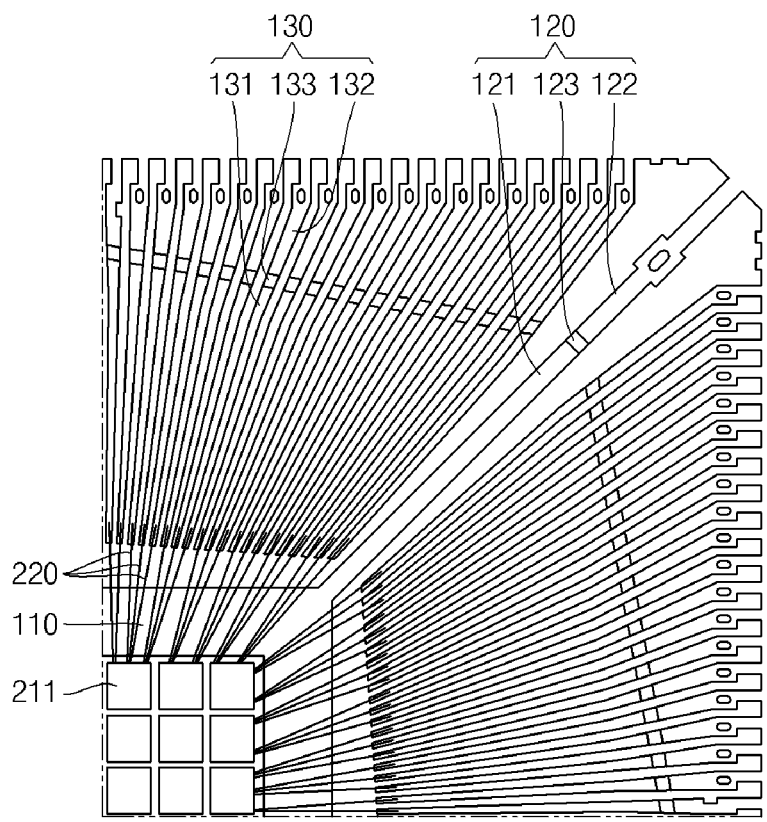
FIG. 8 is a partial top perspective view of the leadframe shown in FIGS. 1 and 1A having a semiconductor die attached and wire bonded thereto.

Referring now to FIG. 6, there is shown a partial perspective view of a heat block 10 in which any of the above-described leadframes 100, 101, 102, 103, 104 may be positioned during a wire bonding process involved in the fabrication of a semiconductor device or package incorporating any of such leadframes 100, 101, 102, 103, 104. In FIG. 8, a semiconductor device or package in a partially fabricated state is depicted, such semiconductor package including the leadframe 100 shown in FIGS. 1 and 1A. In FIG. 8, a semiconductor die 211 is shown as being attached to the top surface of the die pad 110, the peripheral edge of the semiconductor die 211 being spaced inwardly from the peripheral edge segments 111 of the die pad 110. Additionally, in FIG. 8, the semiconductor die 211 is shown as being electrically connected to the first inner lead regions 131 of each of the inner leads 130 through the use of a multiplicity of conductive wires 220. As previously explained, a portion of the top surface of the first inner lead region 131 of each inner lead 130 may be provided with a plating region 134 which extends to the end thereof disposed closest to the die pad 110, the plating regions 134 enhancing the electrical connection of the conductive wires 220 to the first inner lead regions 131 of respective ones of the inner leads 130. Though not shown in FIG. 8, it is contemplated that one or more conductive wires 220 may be used to electrically connect the semiconductor die 211 to the peripheral portion of the top surface of the die pad 110. In this regard, as also indicated above, the leadframe 100 preferably includes a plated region 114 which is formed on the periphery of the top surface of the die pad 110 and extends to each of the peripheral edge segments 111 thereof, such plating region 114 thus being used to enhance the integrity of the electrical connection of any conductive wire 220 to the die pad 110.

The heat block 10 shown in FIG. 6 is an essential component needed to complete the process of electrically connecting the semiconductor die 211 to the inner leads 130 through the use of the conductive wires 220 in the manner described above in relation to FIG. 8. In this regard, in order to achieve good bonding between the conductive wires 220 and the top surfaces of the first inner lead regions 131 of the inner leads 130, or between the conductive wire(s) 220 and the top surface of the die pad 110, a high level of heat must be applied to the leadframe 100. The heat block 10 provides such heat to the leadframe 100 when the leadframe 100 is positioned thereon during the wire bonding process. To facilitate the desired engagement of the leadframe 100 thereto, the heat block 10 includes a body 12 which has a protruding part 11 protruding upwardly from one surface thereof.

Figure 7A:
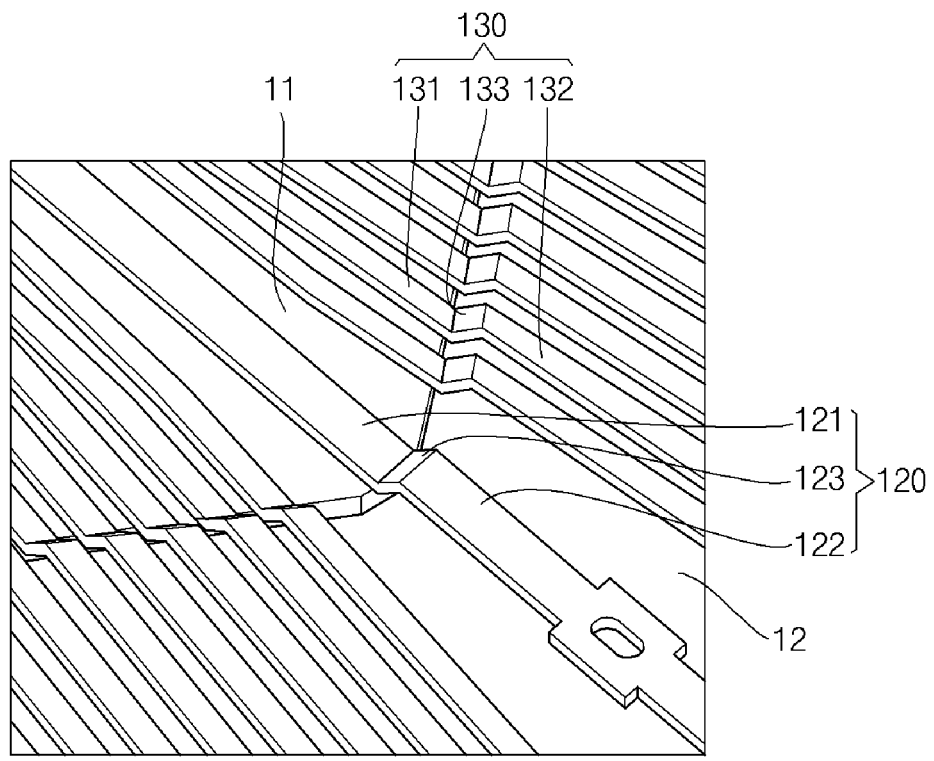
FIG. 7A is a partial top perspective view of the leadframe shown in FIGS. 1 and 1A as interfaced to the heat block shown in FIG. 6 as a precursor to the initiation of a wire bonding process.
Figure 7B:
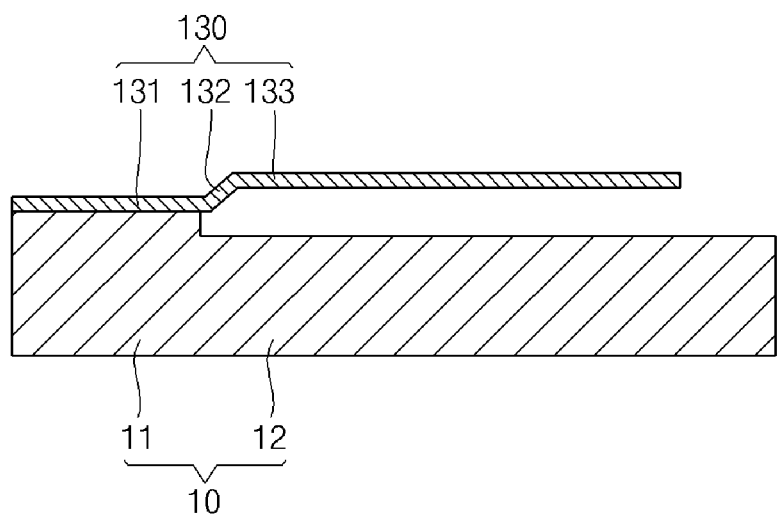
FIG. 7B is a partial side-elevational view of the leadframe shown in FIGS. 1 and 1A as interfaced to the heat block shown in FIG. 6 as a precursor to the initiation of a wire bonding process.

Referring now to FIGS. 7A and 7B, the leadframe 100 is depicted as being cooperatively engaged to the heat block 10 shown in FIG. 6 in a manner as would occur to complete the wire bonding process between the semiconductor die 211 and the inner leads 130 of the leadframe 100 as described above in relation to the partially fabricated semiconductor package shown in FIG. 8. As shown in FIGS. 7A and 7B, the bottom surface of the die pad 110, and the bottom surfaces of the first inner lead regions 131 of the inner leads 130, which extend in generally co-planar relation to each other, are positioned or seated upon the top surface of the protruding part 11 of the heat block 10. As a result, as seen in FIG. 7B, the downsets 132 and second inner lead regions 133 of the inner leads 130 extend in spaced, juxtaposed relation to that surface of the body 12 of the heat block 10 from which the protruding part 11 extends. Since both the die pad 110 and at least portions of the first inner lead regions 131 of the inner leads 130 are positioned upon and supported by the protruding part 11 of the heat block 10, they are not susceptible to being "bounced" during the process of bonding corresponding ends of the conductive wires 220 thereto, thereby avoiding wire bonding failures. Heat transfer between the heat block 10 and the leadframe 100 is also maximized by the direct contact of the die pad 110 and first inner lead regions 131 of the inner leads 130 with the protruding part 11.

In addition, even if the first inner lead regions 131 of the inner leads 130 are formed to be disposed in very close proximity to corresponding peripheral edge segments 111 of the die pad 110, the protruding part 11 of the heat block 10 maintains the generally co-planar relationship between the die pad 110 and the first inner lead regions 131 during the completion of the wire bonding process described above. Stated another way, since a gap or space is not created between the first inner lead regions 131 and the heat block 10, a bouncing phenomenon does not occur to the first inner lead regions 131 during the wire bonding process, such bouncing phenomenon also being prevented as a result of the inner leads 130 and the outer leads 150 also being mutually supported by the dambar 140. Further, since the downsets 123 of the tie bars 120 are not positioned between the plating regions 134 of the first inner lead regions 131 and the die pad 110, or even at a location close to the plating regions 134 of the first inner lead regions 131, but rather are positioned outside of the lead locking tape 160, it is possible to minimize the distance separating the ends of the first inner lead regions 131 of the inner leads 130 from the corresponding peripheral edge segments 111 of the die pad 110, thereby allowing for a reduction in the length of the conductive wires 220 extending therebetween. As is well known in the electrical arts, if the length of the conductive wires 220 is reduced, the electrical resistance is reduced accordingly, thus ultimately improving the electrical characteristics of the semiconductor device or package including the leadframe 100.

Though FIGS. 7A and 7B partially depict the engagement of the leadframe 100 to the heat block 10, and FIG. 8 depicts a partially fabricated semiconductor package including the leadframe 100, those or ordinary skill in the art will recognize that the aforementioned discussion regarding FIGS. 7A, 7B and 8 is equally applicable to each of the leadframes 101, 102, 103 and 104 as well. Along these lines, it is contemplated that the heat block 10 can be used in conjunction with any type of leadframe, so long as such leadframe includes a die pad and first inner lead regions occupying a size or area which is smaller than or equal to that of the protruding part 11 of the heat block 10, as is the case with the die pad 110 and first inner lead regions 131 of the leadframe 100 as shown in FIGS. 7A and 7B. These relative proportions ensure that the tips of the inner leads remains stably seated during the wire bonding process, as opposed to being susceptible to bouncing during such wire bonding process which could result in frequent wire bonding failure.

Figure 9:
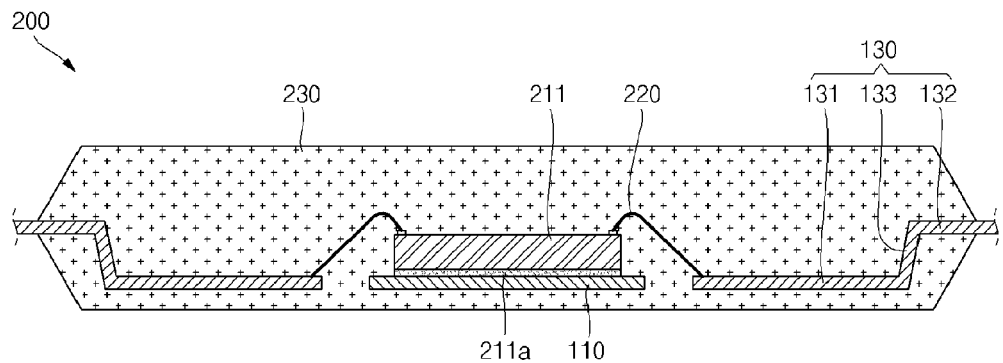
FIG. 9 is a cross-sectional view of a semiconductor package constructed in accordance with a first embodiment of the present invention and including the leadframe shown in FIGS. 1 and 1A subsequent to the singulation thereof.

Referring now to FIG. 9, there is shown a semiconductor device or semiconductor package 200 constructed in accordance with a first embodiment of the present invention, and fabricated to include the leadframe 100 described above in relation to FIGS. 1 and 1A. As will be recognized by those ordinary skill in the art, in the completed semiconductor package 200, the dambar 140 is singulated or removed from the leadframe 100 to facilitate the electrical isolation of the various structural features of the leadframe 100 from each other. More particularly, the dambar 140 is singulated in a manner wherein each of the inner leads 130 is integrally connected to that outer lead 150 of the corresponding set which is aligned therewith, though each joined pair of inner and outer leads 130, 150 is electrically isolated from every other joined pair thereof as well as the die pad 110 and the tie bars 120. However, even after the singulation of the dambar 140, the integral connection between the tie bars 120 and the die pad 110 is maintained.

In the semiconductor package 200, the semiconductor die 211 is attached to the top surface of the die pad 110 through the use of an adhesive layer 211a. The semiconductor package 200 further comprises the above-described conductive wires 220 which are used to electrically connect the semiconductor die 211 to respective ones of the first inner lead regions 131 of the inner leads 130 in the same manner described above in relation to FIG. 8. As also indicated above, in electrically connecting the semiconductor die 211 to the inner leads 130, it is contemplated that the conductive wires 220 will be extended from the semiconductor die 211 to the plating regions 134 on the top surfaces of the first inner lead regions 131 of respective ones of the inner leads 130. Since the die pad 110 and the first inner lead regions 131 extend in generally co-planar relation to each other, the height of the conductive wires 220 is relatively small. Thus, the semiconductor package 200 may be fabricated to have a slimmer profile by virtue of maintaining the height of the conductive wires 220 at a reduced level. The lengths of the conductive wires 220 are also reduced by virtue of the first inner lead regions 131 of the inner leads 130 being formed in extremely close proximity to corresponding peripheral edge segments 111 of the die pad 110. This reduced length of the conductive wires 220 in turn reduces electrical resistance, and ultimately further improves the electrical characteristics of the semiconductor package 200. The conductive wires 220 may be fabricated from aluminum, copper, gold, silver, or a functional equivalent. However, those of ordinary skill in the art will recognize that the present invention is not limited to any particular material for the wires 220. Though not shown in FIG. 9, as indicated above, one or more conductive wires 220 may also be used to electrically connect the semiconductor die 211 directly to the peripheral portion of the top surface of the die pad 110, and in particular to the plating region 114 preferably formed thereon. Such electrical connection allows for the use of the plated die pad 110 as a ground region.

In the semiconductor package 200, the die pad 110, the tie bars 120, the first inner lead regions 131 of the inner leads 130, the downsets 133 of the inner leads 130, and portions of the second inner lead regions 132 of the inner leads 130 are encapsulated or covered by an encapsulant material which, upon hardening, forms a package body 230 of the semiconductor package 200. Also encapsulated by the package body 230 are the semiconductor die 211 and the conductive wires 220 used to electrically connect the same to the inner leads 130. The outer leads 150 are not covered by the package body 230, and hence protrude from respective sections of the peripheral side surface thereof. During the process of fabricating the semiconductor package 200, the dambar 140 of the leadframe 100 is also not covered by the package body 230, so that it may ultimately be removed in the aforementioned manner through the completion of a suitable singulation process subsequent to the formation of the package body 230.

Though not shown in FIG. 9, the exposed outer leads 150 may be bent to assume a gull-winged configuration to allow the same to be electrically connected to an underlying substrate such as a printed circuit board. As indicated above, in order to complete the fabrication of the semiconductor package 200 to allow the same to assume the configuration shown in FIG. 9, the dambar 140 must be removed from the leadframe 100 as explained above. In this regard, it is contemplated that a conventionally known debarring process may be implemented to remove the dambar 140.

Figure 10:
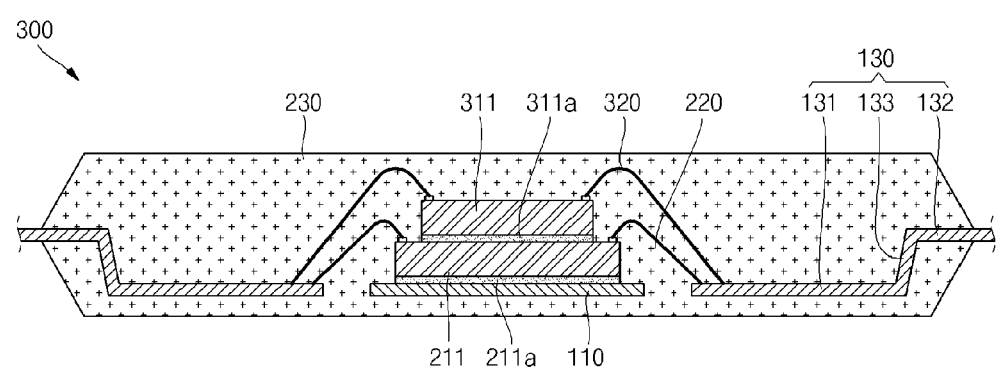
FIG. 10 is a cross-sectional view of a semiconductor package constructed in accordance with a second embodiment of the present invention and including the leadframe shown in FIGS. 1 and 1A subsequent to the singulation thereof.

Referring now to FIG. 10, there is shown a semiconductor device or semiconductor package 300 constructed in accordance with a second embodiment of the present invention. The semiconductor package 300 bears substantial structural similarity to the above-described semiconductor package 200, with only the distinctions between the semiconductor packages 200, 300 being described below.

The sole distinction between the semiconductor package 200, 300 lies in the inclusion of a second semiconductor die 311 in the semiconductor package 300. From the perspective shown in FIG. 10, the second semiconductor die 311 is attached to the top surface of the first semiconductor die 211 through the use of an adhesive layer 311a. The second semiconductor die 311 is electrically connected to the first inner lead regions 131 of the inner leads 130 through the use of conductive wires 320 in the same manner described above in relation to the use of the conductive wires 220 to facilitate the electrical connection of the first semiconductor die 211 to the first inner lead regions 131 of the inner leads 130. Thus, each of the conductive wires 320 is electrically connected to and extended between the second semiconductor die 311 and the plating region 134 disposed on the top surface of the first inner lead region 131 of a corresponding one of the inner leads 130. In the semiconductor package 300, both the second semiconductor die 311 and the conductive wires 320 used to electrically connect the same to the inner leads 130 are covered by the package body 230.

As is further seen in FIG. 10, the width of the first semiconductor die 211 in the semiconductor package 300 exceeds that of the second semiconductor die 311. As a result of this size disparity, the second semiconductor die 311 does not interfere with the conductive wires 220 used to electrically connect the first semiconductor die 211 to the inner leads 130 when the second semiconductor die 311 is attached to the top surface of the first semiconductor die 211 through the use of the adhesive layer 311a. Due to the die pad 110 and first inner lead regions 131 extending in generally co-planar relation to each other, the overall height or profile of the semiconductor package 300 is still minimized, despite the inclusion of the second semiconductor die 311 and the conductive wires 320 used to electrically connect the same to the inner leads 130.

Figure 11:
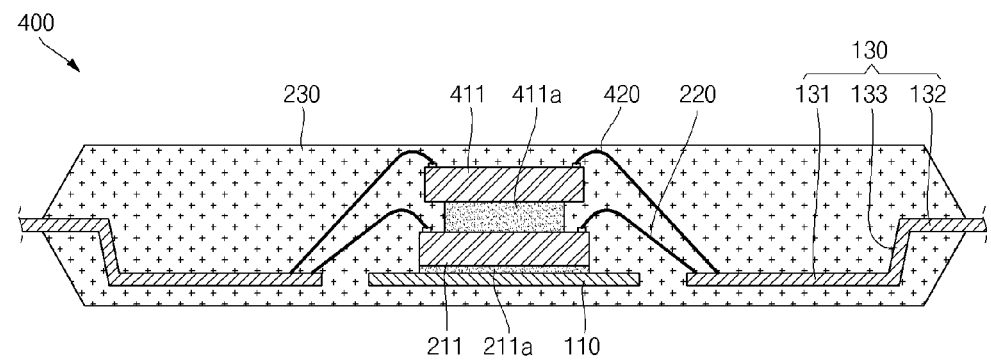
FIG. 11 is a cross-sectional view of a semiconductor package constructed in accordance with a third embodiment of the present invention and including the leadframe shown in FIGS. 1 and 1A subsequent to the singulation thereof.

Referring now to FIG. 11, there is shown a semiconductor device or semiconductor package 400 constructed in accordance with a third embodiment of the present invention. The semiconductor package 400 bears substantial structural similarity to the above-described semiconductor package 300, with only the distinctions between the semiconductor packages 300, 400 being described below.

In the semiconductor package 400, the second semiconductor die 311 described in relation to the semiconductor package 300 is replaced with a second semiconductor die 411 which is attached to the surface of the underlying first semiconductor die 211. However, rather than being directly attached to the underlying first semiconductor die 211 through the use of an adhesive layer such as the adhesive layer 311a described above in relation to the semiconductor package 300, the second semiconductor die 411 in the semiconductor package 400 is maintained at a prescribed distance from the first semiconductor die 211 by virtue of a spacer 411a being interposed therebetween. In this regard, it is contemplated that an adhesive layer will be applied to each of the opposed top and bottom surfaces of the spacer 411a (as viewed from the perspective shown in FIG. 11), with the bottom surface of the spacer 411a being attached to the top surface of the first semiconductor die 211, and the bottom surface of the second semiconductor die 411 being secured to the top surface of the spacer 411a.

In contrast to the first and second semiconductor dies 211, 311 of the semiconductor package 300 which are described above as being of differing sizes, in the semiconductor package 400, the widths of the first and second semiconductor dies 211, 411 are substantially equal to each other. In addition, the width of the spacer 411a is smaller than that of the first and second semiconductor dies 211, 411. The second semiconductor die 411 is electrically connected to the first inner lead regions 131 of the inner leads 130 through the use of conductive wires 420 in the same manner described above in relation to the use of the conductive wires 220 to facilitate the electrical connection of the first semiconductor die 211 to the first inner lead region 131 of the inner leads 130. Thus, each of the conductive wires 420 is electrically connected to and extended between the second semiconductor die 411 and the plating region 134 disposed on the top surface of the first inner lead region 131 of a corresponding one of the inner leads 130. In the semiconductor package 400, both the second semiconductor die 411 and the conductive wires 420 used to electrically connect the same to the inner leads 130 are covered by the package body 230.

In the semiconductor package 400, since the die pad 110 and the first inner lead regions 131 extend in generally co-planar relation to each other, the conductive wires 220 are formed such that they are downwardly wire-bonded from the first semiconductor die 211 to the first inner lead regions 131 of the inner leads 130. The downward wire bonding also holds true in relation to the conductive wires 420 extending from the second semiconductor die 411 to the first inner lead regions 131 of the inner leads 130. Such downward wire bonding of the conductive wires 220, 420 to the first inner lead regions 131 is adapted to prevent electrical shorting between the conductive wires 220, 420, or between the conductive wires 220 and the second semiconductor die 411. Indeed, if the first inner lead regions 131 were positioned higher than the die pad 110, there would be a greater susceptibility to the conductive wires 220 being electrically shorted to the second semiconductor die 411.

If, in the semiconductor package 400, the conductive wires 220 were wire bonded upwardly and the conductive wires 420 wire bonded downwardly, such conductive wires 220, 420 would cross each other into substantially X-shaped pattern, which would create substantially greater susceptibility to electrical shorting or other performance problems in the semiconductor package 400. However, in the semiconductor package 400 electrical shorting between the conductive wires 220, 420, between the conductive wires 220 and the second semiconductor die 411, and between adjacent first inner lead regions 131 (attributable to capillary contact) is substantially prevented by the structural features of the leadframe 100, in combination with the downward wire-bonding of the conductive wires 220, 420 as described above. This reduced susceptibility to electrical shorting is facilitated despite the first and second semiconductor dies 211, 411 being of substantially the same width and provided in a stacked arrangement. However, despite the first and second semiconductor dies 211, 411 being stacked, it is not necessary to form the spacer 411a to be of excessive thickness, nor is it necessary to provide the first and second semiconductor dies 211, 411 in extremely small thicknesses. In addition, the height of the conductive wires 420 can be adjusted over a wide range, allowing wire bonding to be accomplished very easily.

Figure 12:
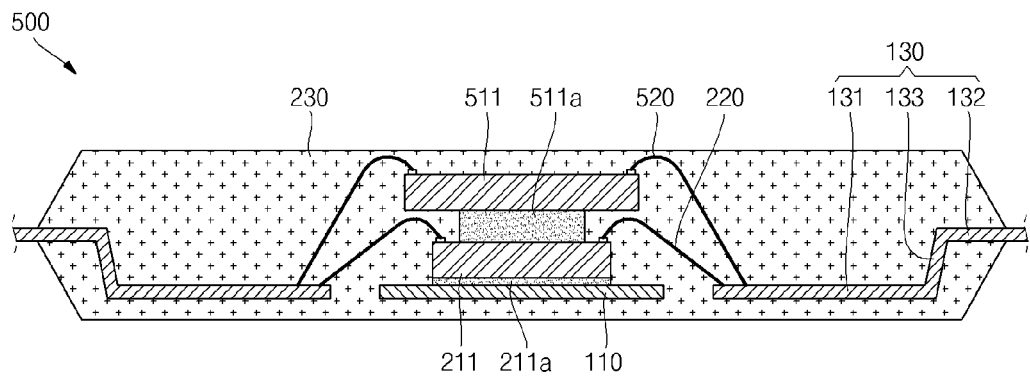
FIG. 12 is a cross-sectional view of a semiconductor package constructed in accordance with a fourth embodiment of the present invention and including the leadframe shown in FIGS. 1 and 1A subsequent to the singulation thereof.

Referring now to FIG. 12, there is shown a semiconductor device or semiconductor package 500 constructed in accordance with a fourth embodiment of the present invention. The semiconductor package 500 bears substantial structural similarity to the above-described semiconductor package 400, with only the distinctions between the semiconductor packages 400, 500 being described below.

In the semiconductor package 500, the second semiconductor die 411 described above in relation to the semiconductor package 400 is substituted with a second semiconductor die 511 which is of a greater width than the underlying first semiconductor die 211. Interposed between the first and second semiconductor die 211, 511 in the semiconductor package 500 is a spacer 511a which is identically configured to the spacer 411a described above, and is secured to each of the first and second semiconductor dies 211, 511 via adhesive layers in a manner also described above in relation to the semiconductor package 400. The second semiconductor die 511 is electrically connected to the first inner lead regions 131 of the inner leads 130 through the use of conductive wires 520 in the same manner described above in relation to the use of the conductive wires 220 to facilitate the electrical connection of the first semiconductor die 211 to the first inner lead regions 131 of the inner leads 130. Thus, each of the conductive wires 520 is electrically connected to and extends between the second semiconductor die 511 and the plating region 134 disposed on the top surface of the first inner lead region 131 of a corresponding one of the inner leads 130. In the semiconductor package 500, both the second semiconductor die 511 and the conductive wires 520 used to electrically connect the same to the inner leads 130 are covered by the package body 230.

In the semiconductor package 500, due to the die pad 110 and the first inner lead regions 131 extending in generally co-planar relation to each other, the conductive wires 220 are able to be formed to have a relatively small height, thus allowing them to facilitate the electrical connection of the first semiconductor die 211 to the inner leads 130, despite the increased sized of the second semiconductor die 511 relative to the first semiconductor die 211. In this regard, as viewed from the perspective shown in FIG. 12, the conductive wires 220 are not shorted to the second semiconductor die 511, despite the second semiconductor die 511 overhanging portions of the conductive wires 220.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure. For example, the semiconductor packages 200, 300, 400, 500 described above may include any of the above-described leadframes 101, 102, 103, 104 as an alternative to the leadframe 100.

What is claimed is:

1. A semiconductor package comprising:
a die pad defining multiple peripheral edge segments;
a plurality of inner leads that each include a downset formed therein, the inner leads being segregated into at least two sets that extend along respective ones of at least two peripheral edge segments of the die pad, wherein each of the inner leads defines first and second inner lead regions that are separated by the downset therein, the first inner lead region being disposed between the downset and the die pad, and wherein the first inner lead region of each of the inner leads is longer than the second inner lead region thereof, and wherein the second inner lead regions of the inner leads of each set thereof are of gradually decreasing length as the inner leads are oriented closer toward the center of an adjacent, corresponding peripheral edge segment of the die pad;
at least one tie bar integrally connected to and extending from the die pad, the tie bar including a downset formed therein that is positioned to segregate the tie bar into at least two regions of differing length;
at least one semiconductor die attached to the die pad and electrically connected to at least one of the inner leads; and
a package body defining a peripheral side surface, the package body at least partially encapsulating the die pad, the inner leads, the tie bars and the semiconductor die such that the downsets of the inner leads and the tie bars are covered by the package body.

2. The semiconductor package of claim 1 further comprising a plurality of outer leads integrally connected to respective ones of the inner leads, at least portions of the outer leads protruding from the side surface of the package body.

3. The semiconductor package of claim 1, wherein the semiconductor die is electrically connected to the inner leads by conductive wires that are covered by the package body.

4. The semiconductor package of claim 1, wherein:
the tie bar defines first and second tie bar regions that are separated by the downset therein, the first tie bar region being disposed between the downset and the die pad;
the die pad, the first inner lead regions and the first tie bar region extend in generally co-planar relation to each other;
the second inner lead regions and the second tie bar region extend in generally co-planar relation to each other; and
conductive wires extending from the semiconductor die to respective ones of the first inner lead regions to electrically connect the semiconductor die thereto.

5. The semiconductor package of claim 1, wherein:
the die pad has a generally quadrangular configuration defining four corner regions;
at least four tie bars are integrally connected to and extend diagonally from respective ones of four corner regions of the die pad; and
the inner and outer leads are segregated into at least four sets that each extend along a respective one of the peripheral edge segments of the die pad between an adjacent pair of the tie bars.

6. The semiconductor package of claim 5, wherein:
the second inner lead regions of an outermost pair of the inner leads of each set thereof are each of a first length;
the second inner lead regions of an adjacent central pair of the inner leads of each set that is aligned with the approximate center of a corresponding peripheral edge segment of the die pad are each of a second length that is less than the first length; and
the second inner lead regions of the inner leads of each set that extend between the outermost and central pairs each gradually decrease from the first length to the second length.

7. The semiconductor package of claim 5, wherein:
the second inner lead regions of two outermost groups of the inner leads of each set are of gradually decreasing length; and
the second inner lead regions of the inner leads of each set that are disposed between the outermost groups are of substantially equal length.

8. The semiconductor package of claim 7, wherein the downsets of the inner leads included in each of the two outermost groups of each set are substantially linearly aligned with the downset of the tie bar disposed closest thereto.

9. The semiconductor package of claim 5, wherein:
the second inner lead regions of an outermost pair of the inner leads of each set thereof are each of a first length;
the second inner lead region of a central inner lead of each set that is aligned with the approximate center of a corresponding peripheral edge segment of the die pad is of a second length that is less than the first length; and
the second inner lead regions of the inner leads of each set that extend between the outermost pair and the central inner lead each gradually decrease from the first length to the second length.

10. The semiconductor package of claim 9, wherein the downset of the central inner lead of each set has an angled configuration.

11. The semiconductor package of claim 9, wherein the downset of the central inner lead of each set, and the downsets of two of the inner leads disposed adjacent thereto and extending along respective ones of opposed sides thereof, are each substantially parallel to the adjacent, corresponding peripheral edge segment of the die pad.

12. The semiconductor package of claim 4, wherein the first tie bar region of the tie bar is longer than the second tie bar region thereof.

13. The semiconductor package of claim 1 further comprising a second semiconductor die stacked upon the semiconductor die and electrically connected to at least one of the inner leads.

14. The semiconductor package of claim 13 further comprising a spacer interposed between the semiconductor die and the second semiconductor die.

15. A semiconductor package comprising:
a die pad defining multiple peripheral edge segments;
a plurality of inner leads that each include a downset formed therein, each of the inner leads defines first and second inner lead regions that are separated by the downset therein, the first inner lead region of each of the inner leads being disposed between the downset and the die pad and being longer than the second inner lead region thereof;
a plurality of tie bars integrally connected to and extending from the die pad, each of the tie bars defining first and second tie bar regions that are separated by a downset therein, the first tie bar region of each of the tie bars being disposed between the downset and the die pad and being longer than the second tie bar region thereof, the first inner lead regions being segregated into at least two sets that each extend along a respective one of at least two peripheral edge segments of the die pad and between an adjacent pair of the tie bars, wherein the second inner lead regions of the inner leads of each set thereof are of gradually decreasing length as the inner leads advance toward the center of an adjacent, corresponding peripheral edge segment of the die pad;
at least one semiconductor die attached to the die pad and electrically connected to the first inner lead region of at least one of the inner leads; and
a package body defining a peripheral side surface, the package body at least partially encapsulating the die pad, the inner leads, the tie bars and the semiconductor die such that the downsets of the inner leads and the tie bars are covered by the package body.

16. The semiconductor package of claim 15, wherein:
the second inner lead regions of an outermost pair of the inner leads of each set thereof are each of a first length;
the second inner lead regions of an adjacent central pair of the inner leads of each set that is aligned with the approximate center of a corresponding peripheral edge segment of the die pad are each of a second length that is less than the first length; and
the second inner lead regions of the inner leads of each set that extend between the outermost and central pairs each gradually decrease from the first length to the second length.

17. The semiconductor package of claim 15, wherein:
the second inner lead regions of two outermost groups of the inner leads of each set are of gradually decreasing length; and
the second inner lead regions of the inner leads of each set that are disposed between the outermost groups are of substantially equal length.

18. A semiconductor package comprising:
a die pad;
a plurality of inner leads that each include a downset formed therein, each of the inner leads defines first and second inner lead regions that are separated by the downset therein, the first inner lead region of each of the inner leads being disposed between the downset and the die pad and being longer than the second inner lead region thereof;
a plurality of tie bars integrally connected to and extending from the die pad, each of the tie bars defining first and second tie bar regions that are separated by a downset therein, the first tie bar region of each of the tie bars being disposed between the downset and the die pad and being longer than the second tie bar region thereof, wherein the inner leads are segregated into multiple sets, and the second inner lead regions of the inner leads of each set thereof are of gradually decreasing length as the inner leads advance toward the center of an adjacent, corresponding peripheral edge segment of the die pad;
at least one semiconductor die attached to the die pad and electrically connected to the first inner lead region of at least one of the inner leads; and
a package body defining a peripheral side surface, the package body at least partially encapsulating the die pad, the inner leads, the tie bars and the semiconductor die such that the downsets of the inner leads and the tie bars are covered by the package body, wherein the downsets within the tie bar and the inner leads being sized and oriented relative to each other to minimize the separation between the inner leads and the die pad.

19. The semiconductor package of claim 18, wherein:
the second inner lead regions of an outermost pair of the inner leads of each set thereof are each of a first length;
the second inner lead regions of an adjacent central pair of the inner leads of each set that is aligned with the approximate center of a corresponding peripheral edge segment of the die pad are each of a second length that is less than the first length; and
the second inner lead regions of the inner leads of each set that extend between the outermost and central pairs each gradually decrease from the first length to the second length.

20. The semiconductor package of claim 18, wherein:
the second inner lead regions of two outermost groups of the inner leads of each set are of gradually decreasing length; and
the second inner regions of the inner leads of each set that are disposed between the outermost groups are of substantially equal length.

* * * * *